United States Patent [19]
Sasaoka

[11] 4,343,873
[45] Aug. 10, 1982

[54] PHOTOGRAPHIC LIGHT-SENSITIVE SILVER HALIDE ELEMENTS

[75] Inventor: Senzo Sasaoka, Minami-ashigara, Japan

[73] Assignee: Fuji Photo Film Company, Ltd., Kanagawa, Japan

[21] Appl. No.: 197,358

[22] Filed: Oct. 15, 1980

[30] Foreign Application Priority Data

Oct. 15, 1979 [JP] Japan ................... 54-132538

[51] Int. Cl.³ .................... G03C 5/04; G03C 1/76
[52] U.S. Cl. .................................. 430/1; 430/2;
430/264; 430/290; 430/363; 430/945; 430/949;
430/950; 430/523
[58] Field of Search ................... 430/363, 1, 2, 945,
430/949, 950, 946, 290, 264

[56] References Cited

U.S. PATENT DOCUMENTS

| 1,479,939 | 1/1924 | Sulzer | 430/966 |
| 3,411,907 | 11/1968 | Whitmore et al. | 430/950 |
| 3,523,022 | 8/1970 | Byerley et al. | 430/606 |
| 4,047,956 | 9/1977 | Blake | 430/966 |
| 4,212,672 | 7/1980 | Mihara et al. | 430/945 |

FOREIGN PATENT DOCUMENTS 2813495 10/1978 Fed. Rep. of Germany ...... 430/302

Primary Examiner—Mary F. Downey
Attorney, Agent, or Firm—Sughrue, Mion, Zinn, Macpeak & Seas

[57] ABSTRACT

A photographic light-sensitive silver halide element is described comprising a support, at least one light-sensitive silver halide emulsion layer and a light-scattering layer. This element is used for forming a dot image by a photographic exposure using laser through a contact screen. The light-scattering layer is provided in such a manner that the silver halide emulsion layer is exposed to laser through the light-scattering layer.

31 Claims, No Drawings

PHOTOGRAPHIC LIGHT-SENSITIVE SILVER HALIDE ELEMENTS

BACKGROUND OF THE INVENTION

1. Field of the Invention

This invention relates to a photographic light-sensitive silver halide element, particularly an element intended for exposure by use of laser light, and more particularly to a photographic light-sensitive silver halide element which is intended for exposure through a contact screen by use of laser light to form dot images.

2. Description of the Prior Art

In printing an image having continuous gradation, as is well known in the art, the image is broken up into small dots, varying in size according to the density thereof, and is converted into a so-called dot image. Such a dot image is produced by applying onto a high contrast light-sensitive element, e.g., a lithographic film, a photographic exposure through a contact screen or glass screen.

Light sources which have heretofore been used for the application of a photographic exposure through a contact screen to produce such dot images include a tungsten lamp, a mercury lamp, a xenon lamp, a glow lamp, etc.

Recently an image-forming method according to the so-called scanner system has been increasingly used, in which according to an image signal obtained by scanning an original image having continuous gradation, an exposure is applied onto a photographic light-sensitive silver halide element to produce a negative or positive image corresponding to the original image. This image-forming method of the scanner system includes the use of a dot generator system in which a dot generator is used, and the so-called screen scanner system in which the dot image is obtained by use of the contact screen, as described above.

As a light source for use in the dot image-forming method of the scanner system, the light sources as described above, e.g., a tungsten lamp, are not suitable, because of their relatively poor outputs and short lives. Recently, therefore, a scanner has been developed in which coherent laser light is used as the exposure light source.

For the generation of laser light, ruby, neon-helium gas, argon gas, krypton gas, helium-cadmium gas, carbon dioxide gas, etc., laser materials are used. Of these, the neon-helium gas is relatively inexpensive, and produces a stable output, therefore it is widely used.

In order to apply a photographic exposure through a contact screen onto a light-sensitive element, e.g., a lithographic film, to form a dot image, it is necessary to bring the contact screen into intimate contact with the light-sensitive element, for example, by a vacuum-contacting method.

When light enters the interface between two different members in close contact with each other, an interference phenomenon of light occurs. This phenomenon is well known as Newton's Rings. Therefore, when a high contrast light-sensitive element is exposed through a contact screen, this interference phenomenon of light occurs in the interface between the screen and the light-sensitive element, causing a striped pattern (hereinafter referred to as the "interference fringe") to be formed in the light-sensitive element.

In particular, when laser light is used as the light source, the characteristic properties of laser light, i.e., that it is coherent and has a uniform phase, the interference phenomenon is intensified, as a result of which the interference fringe appears more strongly.

When the interference occurs in a pattern having a dot area of about 10% to 20% of the area wherein the dots are scattered, e.g., photographs of a clear sky and electric articles having pale colors, the interference fringe is printed as is and appears in the printed image, and it cannot be retouched. When the interference fringe occurs in a pattern having a dot area of about 50%, e.g., a portrait, a contour line-like pattern is formed in the printed image, leading to a serious defect in the dot image.

Therefore, minimizing the occurrence of interference fringe in a method of producing a dot image in a high contrast light-sensitive element by applying a photographic exposure thereto through a contact screen using a laser as the light source (e.g., a screen scanner method) has been the important subject of research by those engaged in the development of such methods.

Though it was proposed to minimize the formation of Newton's Rings using matting agents such as colloidal silica or polymethyl methacrylate, these matting agents have been found unsatisfactory for such use in a light-sensitive element intended for photographic exposure using a laser light.

SUMMARY OF THE INVENTION

As a result of extensive investigations, it has now been found that the occurrence of interference fringe can be minimized by:

(1) providing a light-scattering layer through which a light-sensitive silver halide emulsion layer is exposed to laser light;

(2) employing as light-scattering particles for use in the light-scattering layer particles which are capable of being dissolved and removed at a development step; and (3) limiting the size of the light-scattering particles to a specific range.

This invention, therefore, provides a photographic light-sensitive silver halide element to be exposed by use of laser light which comprising a support, at least one light-sensitive silver halide emulsion layer overlying the support and a light-scattering layer provided so that the light-sensitive silver halide emulsion layer be exposed to laser light only through the light-scattering layer wherein the light-scattering layer contains light-scattering particles capable of being dissolved and removed at a development step and the diameter of light-scattering particle is from 50 to 300% of the wavelength of the laser light for use in the exposure.

DETAILED DESCRIPTION OF THE INVENTION

Light-scattering particles as used in this invention should be dissolved in an image development process, that is, be soluble, for example, in a developer or a fixer. Examples of such light-scattering particles include inorganic compounds such as silver halide, cadmium sulfate, calcium carbonate, cadmium carbonate, barium oxalate, zinc hydroxide, thallium chloride, etc., and organic compounds such as a polymethyl methacrylate-acrylic acid copolymer, free carboxyl or sulfonyl group-containing starch derivatives, etc.

Of these compounds, those having high refractive indexes and capable of being easily dissolved in the development step are preferred, with silver halide particles being particularly preferred.

Substantially light-insensitive silver halide particles are preferably used as light-scattering particles. By the term "substantially light-insensitive" is meant that the silver halide is not at all sensitive to light, or has sensitivity of such a limited extent that it cannot produce a latent image which is developable.

Such light-insensitive silver halide particles are not subject to any special limitations in the halogen composition, and any of silver bromide, silver chlorobromide, silver iodobromide, etc., can be used. When the light-sensitive silver halide emulsion is of the so-called lith type and developed with a lith developer, preferred light-insensitive silver halide particles are silver bromide and silver iodobromide.

As such light-insensitive silver halide particles, particles which have not been subjected to chemical aging are preferably used.

With regard to the size of light-scattering particle, the diameter thereof should be from 50% to 300% of the wavelength of the laser light used as a light source, and preferably from 50% to 150%, and more preferably 80% to 120%. For example, when neon-helium laser (632.8 nm=0.6328$\mu$) is employed, the light-scattering particles used desirably have diameters within the range of from about 0.32$\mu$ to 1.90$\mu$, preferably from 0.32$\mu$ to 0.95$\mu$, and especially preferably from 0.4$\mu$ to 0.7$\mu$.

Since the wavelength of a laser light to be used will be known to one skilled in the art, the size of light-scattering agents can be automatically determined as indicated above. Other laser lights which can be preferably used as a light source in the present invention have the following wavelengths:

ruby (694.3 and 692.9 nm)
argon gas (488, 515 and 458 nm)
krypton gas (647, 568 and 531 nm)
helium-cadmium gas (441.6, and 325.0 nm)

The particle size as used in this invention is determined by the so-called projected sectional area approximation method, that is, a particle appearing on an electron microscope replica photograph subjected to shadowing is measured, for example, with a particle size measuring apparatus (TGZ-3) produced by Karl-Zeiss Co. and the diameter of a circle having the same projected sectional area as the particle is taken as the diameter of the particle.

For further details of the method of determining the particle size, reference can be made to W. Peelaers, *Sci. and Ind. Photogr.*, 38, 33 (1967).

The amount of the light-scattering particles used is from 0.2 to 10 g per square meter, with the amount of from 0.3 to 2.0 g being particularly preferred.

While the thickness of the light-scattering layer is not critical, it is usually 0.4 to 5$\mu$, and the range of 0.6 to 2$\mu$ is particularly preferred.

The light-scattering layer is preferably light-insensitive. In addition to the light-scattering particle, a binder such as a hydrophilic colloid (e.g., gelatin), a gelatin cross-linking agent, a surface active agent, a polymer latex, a matting agent (for example, for purposes of facilitating retouching the surface by hand, such as particles of polymethyl methacrylate, silicon dioxide or the like, and preferably having average diameters of from 2 to 5$\mu$ are preferred), a plasticizer, etc., can be incorporated into the light-scattering layer.

In connection with these additives, reference can be made to *Research Disclosure*, Vol. 176, pp. 22 to 26 (December, 1978).

The light-scattering layer of this invention is provided between the laser light source and the light-sensitive silver halide emulsion layer, that is, it is provided in such a manner that the light-sensitive silver halide emulsion layer can be exposed to the laser light source therethrough. For example, when at least one light-sensitive silver halide emulsion layer is overlaid on the support, the light-scattering layer is provided on the top light-sensitive silver halide emulsion layer. If desired, a surface protective layer may be provided on the light-scattering layer.

Usually a photographic exposure is applied from the side of the element including light-sensitive silver halide emulsion layer, but it may be applied from the back layer (i.e., the reverse side of the support). In a light-sensitive element as used in the latter case (referred to as a back-photographing light-sensitive element), the light-scattering layer is provided on the back layer or between the light-sensitive silver halide emulsion layer and the support.

Hereinafter the light-sensitive silver halide emulsion layer of the present light-sensitive element will be explained.

Any light-sensitive silver halide emulsions can be used so long as when used in combination with developers as described later, they provide $\gamma$ (Gamma, i.e., the slope of the characteristic curve) values of at least 10. For example, (1) so-called lith type silver halide emulsions and (2) high contrast silver halide emulsions except for the lith type silver halide emulsions can be used.

As lith type silver halide emulsions, those containing, as the silver halide, silver chlorobromide comprising 60 mol% or more (preferably 75 mol% or more) of silver chloride and 0 to 5 mol% of silver iodide or silver iodochlorobromide are preferred. While the shape, crystal habit, size distribution, etc., of silver halide particles are not critical, particles having diameters of 0.7$\mu$ or less are preferred.

These silver halide emulsions can be increased in sensitivity by the use of gold compounds such as chloroauric acid salts, gold trichloride, etc., noble metal salts such as rhodium, iridium, etc., sulfur compounds capable of forming silver sulfide on reacting with silver salts, and reducing substances such as stannous salts, amines, etc.

Vehicles which can be used for the silver halide emulsion include gelatin, modified gelatin, gelatin derivatives, hydrophilic synthetic polymers, etc.

If desired, polymer latexes of homo- or copolymers of alkyl acrylate, alkyl methacrylate, acrylic acid, glycidyl acrylate or the like, as described in U.S. Pat. Nos. 3,411,911, 3,411,912, 3,142,568, 3,325,286, 3,547,650, Japanese Patent Publication No. 5331/70, etc., can be added to the silver halide emulsion layer or other layers, for the purpose of improving the dimensional stability of photographic elements, improving film properties, etc.

Anti-foggants known in the art, such as heterocyclic compounds (e.g., 4-hydroxy-6-methyl-1,3,3a,7-tetrazaindene, 3-methylbenzothiazole, 1-phenyl-5-mercapto-tetrazole, etc.), mercury-containing compounds, mercapto compounds, etc., and those as described in Japanese Patent Application (OPI) Nos. 81024/74, 6306/75, 19429/75 (the term "OPI" as used herein refers to a "published unexamined Japanese patent application") and U.S. Pat. No. 3,850,639 can be used in the photographic emulsions.

Lith type silver halide emulsions of this invention can be subjected to ortho or panchromatic spectral sensitization or supersensitization by use of cyanine dyes such as cyanines, merocyanines, carbocyanines, etc., or mixtures thereof, or mixtures of such cyanine dyes and other known styryl dyes, etc. In particular, those sensitizing dyes as described in Japanese Patent Application (OPI) Nos. 95836/76, 115821/76, 115822/76, 106422/76, 106423/76, 33622/76, 18726/79, Japanese Patent Publication No. 21366/77, U.S. Pat. Nos. 3,567,458, 3,847,621 are preferably used.

Known hardening agents can be used in this invention, as described, for example, in U.S. Pat. Nos. 2,732,316, 3,100,704, 3,288,775, and 3,635,718. Examples of useful hardening agents include aldehyde compounds, ketone compounds, reactive halogen-containing compounds (e.g., 2-hydroxy-4,6-dichloro-1,3,5-triazine, etc.), reactive olefin compounds, N-methylol compounds, aziridine compounds, carbodiimido compounds, etc.

Surface active agents can be added to photographic emulsions used in this invention as auxiliary coating agents or for the purpose of improving photographic characteristics.

Preferred examples of such surface active agents include natural surface active agents such as saponin, nonionic surface active agents such as alkyleneoxide based surface active agents (e.g., those as described in Japanese Patent Application (OPI) Nos. 156423/75, 69124/74, 3217/78), glycide based surface active agents, anionic surface active agents containing acidic groups such as carboxylic acid groups, sulfonic acid groups (e.g., as described in U.S. Pat. No. 3,415,649), phosphoric acid groups, a sulfuric acid ester group, etc., and amphoteric surface active agents such as amino acids, aminosulfonic acids, sulfuric acid or phosphoric acid ester of aminoalcohol, etc.

Preferred anionic surface active agents are those based on sulfonic acid and those described in Japanese Patent Publication No. 5331/70, Japanese Patent Application (OPI) No. 156423/75, and those described in U.S. Pat. No. 3,415,649.

Examples of such preferred anionic surface active agents are as follows:

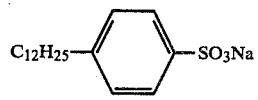

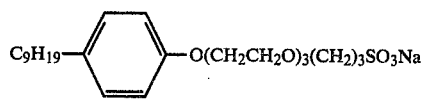

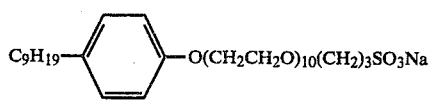

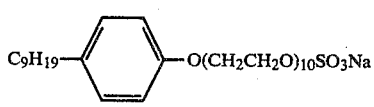

-continued

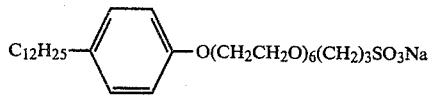

The amount of anionic surface active agent added to the photographic emulsion layer is preferably 0.01 g to 10 g per mol of silver halide, with the range of 0.05 g to 5 g being particularly preferred.

Development accelerators that can be used for photographic emulsions used in the invention are described, for example, in U.S. Pat. Nos. 3,288,612, 3,333,959, 3,345,175, 3,708,303, British Pat. No. 1,098,748, West German Pat. Nos. 1,141,531, 1,183,784.

Other useful emulsion additives and methods for production of light-sensitive elements, etc., are described, e.g., in the above-cited *Research Disclosure*, Vol. 176, pp. 22–26 (December, 1978).

The lith type developer for use in developing the lith type silver halide emulsion fundamentally comprises ortho or para-dihydroxybenzene, an alkali agent, a small amount of free sulfite and a sulfurous acid ion buffer. Such lith type developers are well known, as described, for example, in U.S. Pat. No. 3,128,180.

Ortho and para-dihydroxybenzene developing agents are well known in the field of photography, and it can readily be selected by those skilled in the art. Examples are hydroquinone, chlorohydroquinone, bromohydroquinone, isopropylhydroquinone, toluhydroquinone, methylhydroquinone, 2,3-dichlorohydroquinone, 2,5-dimethylhydroquinone and the like. Of these compounds, hydroquinone is particularly preferred.

These developing agents can be used alone or in combination with each other. The amount of the developing agent added is from 1 to 100 g, and preferably from 5 to 80 g, per liter of the developer.

A sulfurous acid ion buffer is used in an amount sufficient to maintain the concentration of sulfite in the developer substantially constant. Examples include aldehyde-alkali hydrogensulfite addition products such as a formalin-sodium hydrogensulfite addition product, ketone-alkali hydrogensulfite addition products such as an acetone-alkali hydrogensulfite addition product, carbonyl hydrogensulfuric acid-amine condensates such as sodium-bis(2-hydroxyethyl)aminomethane sulfonate, etc.

The amount of the sulfurous acid ion buffer used is preferably from about 13 to 130 g per liter of the developer.

By adding sulfurous acid alkali salts such as sodium sulfite to the developer as used in this invention, the concentration of free sulfurous acid ions can be controlled. The amount of the sulfite added is generally 5 g or less per liter of the developer and in particular, the range of 3 g or less is preferred, although it may be more than 5 g.

In many cases, it is preferred to incorporate alkali halide (particularly, bromides such as sodium bromide and potassium bromide) as a development controlling agent. Furthermore, it is preferred to add the alkali halide in an amount of from 0.01 to 10 g, and preferably from 0.1 to 5 g, per liter of the developer.

The high contrast silver halide emulsion as used in this invention includes, in addition to the above-described lith type silver halide emulsion, a silver halide emulsion which can provide high contrast on developing with stable developers other than lith type developers, in the presence of tetrazolium salts, hydrazine compounds or the like. See, for example, J. A. C. Yur, *J. Franklin Institute,* Vol. 239, pp. 221–230 (1945).

With regard to compositions and developing methods of such high contrast silver halide emulsions, reference can be made, for example, to Japanese Patent Application (OPI) Nos. 18317/77, 95015/78, 95016/78, 95017/78, 95018/78, 93822/78, 95618/78, 95619/78, 95628/78, 137133/78, 37732/79, 40629/79.

Sensitizing Dye (I)

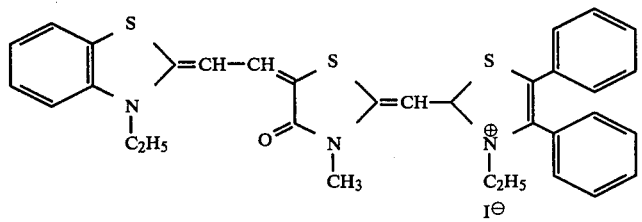

Compound (II)

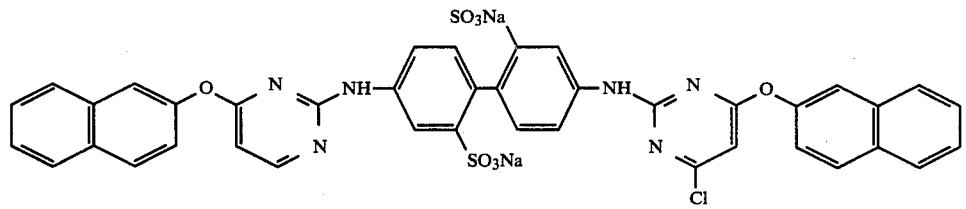

Compound (III)

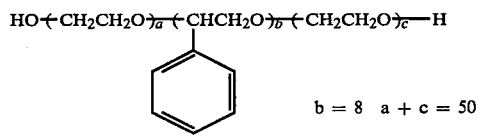

b = 8   a + c = 50

Supports which can be used in the formation of light-sensitive elements of this invention include a polyester film, such as polyethylene terephthalate, a cellulose ester film, such as cellulose triacetate, a polycarbonate film, etc. Of these films, a polyethylene terephthalate film is preferred.

The developing temperature and developing time of light-sensitive elements of this invention are subject to no special limitations, and preferably a temperature of from 20° C. to 50° C. (and particularly from 25° C. to 40° C.), and a time of from 30 seconds to 5 minutes (and particularly from 1 to 3 minutes), respectively, are used.

The composition of the fixing solution, temperature and time are not critical.

The following examples are given to illustrate this invention in greater detail.

EXAMPLE 1

(i) Preparation of Light-Sensitive Silver Halide Emulsion

A silver halide emulsion consisting of 80 mol% of silver chloride, 19.5 mol% of silver bromide and 0.5 mol% of silver iodide was prepared by application of gold sensitization and sulfur sensitization. The average particle diameter of silver halide particles was $0.35\mu$.

0.06 g/AgX mol of Sensitizing Dye (I) and 0.14 g/AgX mol of Compound (II) were added to 625 g of the silver halide emulsion. Additionally, 0.3 g/AgX mol of 4-hydroxy-6-methyl-1,3,3a,7-tetrazaindene (stabilizer), 0.70 g/AgX mol of Polyalkyleneoxide Compound (III), 2 g/AgX mol of sodium dodecylbenzenesulfonate (surface active agent), 0.8 g/AgX mol of mucochloric acid (hardening agent) and 40 g/AgX mol of the polymer latex as described in Japanese Patent Publication No. 5331/70 were successively added to thereby prepare a light-sensitive silver halide emulsion.

(ii) Preparation of Coating Solution for Light-Scattering

| Layer | Amounts |
|---|---|
| Gelatin | 260 g |
| 2,4-Dichloro-6-hydroxy-s-triazine Sodium Salt | 4 g |
| Sodium Dodecylbenzenesulfonate | 10 g |
| Light-Scattering Particles | See Table 1 |
| Matting Agent | See Table 1 |
| Water | 5 l |

(iii) Preparation of Coating Solution for Back Layer

An aqueous solution containing 50 g/100 g gelatin (dry basis) of colloidal silica (having about 935 in an $SiO_2/K_2O$ weight ratio obtained by adding potassium hydroxide to a colloidal silica solution having an $SiO_2/Na_2O$ weight ratio of about 500 wherein the $SiO_2/Na_2O$ ratio refers to a weight ratio of $SiO_2$ to sodium hydroxide expressed by converting the sodium hydroxide into $Na_2O$) was prepared (same as Sample (4) in Example 1 of Japanese Patent Application (OPI) No. 123916/78), provided as the coating solution of the back layer.

(iv) Production of Lith Type Photographic Light-Sensitive Element

The back layer was first coated on a subbing polyethylene terephthalate film (thickness 100μ). Thereafter, on the opposite side of the film the light-sensitive silver halide emulsion layer and the light-scattering layer were coated simultaneously by an extrusion method in such a manner that the light-scattering layer overlaid the light-sensitive silver halide emulsion layer, to thereby produce lith type photographic light-sensitive elements, hereinafter referred to as Samples (1) to (7).

After drying, the thickness of the light-sensitive silver halide emulsion layer was 5.0μ and the thickness of the light-scattering layer was 0.8μ.

The light-scattering layers contained, in addition to light scattering particles as shown in Table 1, polymethyl methacrylate particles (average particle diameter: 4.0μ; 0.05 g/m$^2$) as a matting agent. The light-scattering particles used in Samples (1) to (7) are shown in Table 1.

These samples were exposed by the following two methods:

Method (1): The sample was brought in contact with a negative gray contact screen (produced by Dai Nippon Screen Co., 150 L/inch) and exposed for 1 second through a step wedge having a step difference of 0.1 (log E) to white tungsten light (2860° K.).

Method (2): The sample was brought in contact with the same negative gray contact screen as used in Method (1) and exposed for 1/100,000 second through the same wedge as used in Method (1) by use of a neon-helium laser generator (GAS LASER GLG 2034, produced by Nippon Electric Co., Ltd.).

The amount of exposure was controlled with a neutral gray filter so that the exposure in Methods (1) and (2) were equal to each other.

(vi) Development and Evaluation

After exposure, each sample was developed at 27° C. for 100 seconds with the lith developer as shown in Table 2 in an automatic developing apparatus. After the development, the occurrence of interference fringe and turbidity (haze) of non-image areas were examined with the naked eye, and the results are shown in Table 1.

As can be seen from Table 1, with Samples (3) and (4) of this invention in which light-insensitive AgBr particles having diameters of 0.6μ and 1.5μ, respectively, were used as light-scattering agents, even if they were exposed by use of laser (Method (2)), the interference fringe occurred limitedly and no haze was formed. In particular, with Sample (3), the interference fringe did not occur at all, which is greatly preferred.

On the other hand, with Samples (5) and (6) in which polymethyl methacrylate and SiO$_2$ particles, respectively, having the same size (0.6μ) as Sample (3) were used as light-scattering agents, the occurrence of interference fringe could be controlled. However, these latter light-scattering agents remained in light-sensitive elements after the development processing, causing an increase in haze, which is not preferred from a practical standpoint.

TABLE 1

| | Light-Scattering Layer | | Interference Fringe | | Haze | |
| | | | Exposure Method (1) | Exposure Method (2) | Exposure Method (1) | Exposure Method (2) |
| Sample | Matting Agent | Light-Scattering Agent | | | | |
|---|---|---|---|---|---|---|
| 1 | Polymethyl Methacrylate Particles (average particle diameter 4.0μ) 0.05 g/m$^2$ | — | o | x | o | o |
| 2 | Polymethyl Methacrylate Particles (average particle diameter 4.0μ) 0.05 g/m$^2$ | Light-Insensitive AgBr Particles (0.2μ) 1.0 g/m$^2$ | o | x | o | o |
| 3 (Invention) | Polymethyl Methacrylate Particles (average particle diameter 4.0μ) 0.05 g/m$^2$ | Light-Insensitive AgBr Particles (0.6μ) 1.0 g/m$^2$ | o | o | o | o |
| 4 (Invention) | Polymethyl Methacrylate Particles (average particle diameter 4.0μ) 0.05 g/m$^2$ | Light-Insensitive AgBr Particles (1.5μ) 1.0 g/m$^2$ | o | Δ | o | o |
| 5 | Polymethyl Methacrylate Particles (average particle diameter 4.0μ) 0.05 g/m$^2$ | Polymethyl Methacrylate Particles (0.6μ) 1.0 g/m$^2$ | o | o | x | x |
| 6 | Polymethyl Methacrylate Particles (average particle diameter 4.0μ) 0.05 g/m$^2$ | SiO$_2$ (0.6μ) 1.0 g/m$^2$ | o | o | x | x |

Evaluation of Interference Fringe:
  o: No occurrence
  Δ: Occurred slightly
  X: Occurred frequently Evaluation of Haze:
  o: No haze observed in non-image areas
  X: Turbidity (haze) observed in non-image areas

TABLE 2

| Developer | Amount |
|---|---|
| Hydroquinone | 15 g |
| Addition Product of Formaldehyde and Sodium Hydrogensulfite | 50 g |
| Potassium Carbonate | 30 g |
| Sodium Sulfite | 2.5 g |
| Potassium Bromide | 2.0 g |
| Boric Acid | 5.0 g |
| Sodium Hydroxide | 3.0 g |

TABLE 2-continued

| Developer | Amount |
| --- | --- |
| Triethyleneglycol | 40 g |
| Disodium Ethylenediaminetetraacetate | 1.0 g |
| Diethanolamine | 10 g |
| Water to make | 1,000 ml |

EXAMPLE 2

(i) Preparation of Light-Sensitive Silver Halide Emulsion

Same as in Example 1.

(ii) Preparation of Light-Scattering Layer

| | Amount |
| --- | --- |
| Gelatin | 260 g |
| 2,4-Dichloro-6-hydroxy-s-triazine | 4 g |
| Sodium Dodecylbenzenesulfonate | 10 g |
| Light-Insensitive AgBr Particles (0.6μ) | 160 g |

(iii) Production of Surface Protective Layer

| | Amount |
| --- | --- |
| Gelatin | 260 g |
| Dodecylbenzenesulfonic Acid | 4 g |
| Polymethyl Methacrylate Particles (4.0μ) | 24 g |
| Water | 5 l |

(iv) Production of Back Layer

Same as in Example 1.

(v) Production of Light-Sensitive Element

The back layer was provided in a thickness of 5μ on one surface of an undercoated polyethylene terephthalate film (thickness 100μ). Thereafter, on the reverse side of the support were coated at the same time the light-sensitive emulsion layer (AgX 10 g/m²), the light-scattering layer (light-insensitive AgBr 1.0 g/m²) and the surface protective layer (polymethyl methacrylate 0.05 g/m²) to provide a layer construction comprising the support, the light-sensitive emulsion layer on the support, the light-scattering layer on the light-sensitive emulsion layer, and the surface protective layer on the light-scattering layer.

(vi) Exposure and Evaluation

The light-sensitive silver halide element so obtained was exposed by Method (2) of Example 1 and developed in the same manner as in Example 1.

No occurrence of interference fringe and no increase in haze were observed.

While the invention has been described in detail and with reference to specific embodiments thereof, it will be apparent to one skilled in the art that various changes and modifications can be made therein without departing from the spirit and scope thereof.

What is claimed is:

1. A laser-sensitive photographic light-sensitive silver halide element for use in the formation of a dot image by a photographic exposure using a laser light, comprising a support, at least one layer of a light-sensitive silver halide emulsion providing a gamma value of at least 10, and a light-scattering layer provided in such a manner that the light-sensitive silver halide emulsion layer is exposed to the laser light through the light-scattering layer, wherein the light-scattering layer contains substantially light-insensitive light-scattering particles capable of being dissolved and removed in a development step and the diameter of light-scattering particles is from 50% to 150% of the wavelength of the laser light for use for the exposure.

2. A photographic light-sensitive silver halide element as in claim 1 wherein the light-scattering particles are substantially light-insensitive silver halide particles.

3. A photographic light-sensitive silver halide element as in claim 1 wherein the light-sensitive silver halide emulsion is a lith type silver halide emulsion.

4. A photographic light-sensitive silver halide element as in claim 2 wherein the concentration of the light-insensitive silver halide particles is from 0.3 to 2.0 g/m².

5. A photographic light-sensitive silver halide element as in claim 2 wherein the light-scattering layer contains a matting agent having particles with diameters within the range of from 2 to 5μ.

6. A photographic light-sensitive silver halide element as in claim 5 wherein the matting agent is polymethyl methacrylate.

7. A photographic light-sensitive silver halide element as in claim 1 wherein a surface protective layer is provided on the light-scattering layer.

8. A photographic light-sensitive silver halide element as in claim 7 wherein the surface protective layer contains a matting agent of polymethyl methacrylate having an average particle diameter of from 2 to 5μ.

9. A photographic light-sensitive silver halide element as in claim 1 or 2, wherein the element comprises, in sequence, the support, at least one light-sensitive silver halide emulsion layer, and the light-scattering layer.

10. A photographic light-sensitive silver halide element as in claim 1 or 2, wherein the element comprises, in sequence, the support, the light-scattering layer, and at least one light-sensitive silver halide emulsion layer.

11. A photographic light-sensitive silver halide element as in claim 1 or 2, wherein the element comprises, in sequence, the light-scattering layer, the support, and at least one light-sensitive silver halide emulsion layer.

12. A photographic light-sensitive silver halide element as in claim 1, wherein the diameter of the light-scattering particles is from 50% to 100% of the wavelength of the laser light.

13. A photographic light-sensitive silver halide element as in claim 1, wherein the diameter of the light-scattering particles is from 80% to 120% of the wavelength of the laser light.

14. A photographic light-sensitive silver halide element as in claim 1, wherein the laser light is that of a neon-helium laser and the light-scattering particles have diameters within the range of from about 0.32μ to 1.90μ.

15. A photographic light-sensitive silver halide element as in claim 12, wherein the laser light is that of a neon-helium laser and the light-scattering particles have diameters within the range of from 0.32μ to 0.95μ.

16. A photographic light-sensitive silver halide element as in claim 13, wherein the laser light is that of a neon-helium laser and the light-scattering particles have diameters within the range of from 0.4μ to 0.7μ.

17. A photographic light-sensitive silver halide element as in claim 1 or 2, wherein the amount of light-scattering particles used is from 0.2 to 10 g/m².

18. A method for forming a dot image comprising exposing a laser-sensitive photographic light-sensitive silver halide element to a laser light through a contact screen, wherein said photographic light-sensitive silver halide element comprises a support, at least one layer of a light-sensitive silver halide emulsion providing a gamma value of at least 10, and at least one light-scattering layer provided in such a manner that the light-sensitive silver halide emulsion is exposed to the laser light through the light-scattering layer, wherein the light-scattering layer contains substantially light-insensitive light-scattering particles capable of being dissolved and removed in a development step and selected to have a diameter within the range of from 50% to 150% of the wavelength of the laser light used for the exposure.

19. A method as in claim 18, wherein the light-scattering particles are substantially light-insensitive silver halide particles.

20. A method as in claim 18, wherein the diameter of the light-scattering particles is from 50% to 150% of the wavelength of the laser light.

21. A method as in claim 18, wherein the diameter of the light-scattering particles is within the range of from 80% to 120% of the wavelength of the laser light.

22. A method as in claim 18, 19, 20, or 21, wherein the laser light is produced by a neon-helium laser.

23. A method as in claim 22, wherein the concentration of the light-scattering particles is from 0.3 to 2.0 g/m².

24. A method as in claim 23, wherein the light-scattering layer contains a matting agent having particles with diameters in the range of from 2 to 5μ.

25. A method as in claim 24, wherein the matting agent is polymethyl acrylate.

26. A method as in claim 25, wherein a surface protective layer is provided on the light-scattering layer.

27. A method as in claim 26, wherein the surface protective layer contains a matting agent of polymethyl acrylate having an average particle diameter of from 2 to 5μ.

28. A method for producing a photographic image with minimized formation of interference fringes which comprises imagewise exposing a laser-sensitive photographic light-sensitive silver halide element using laser light, wherein said photographic light-sensitive silver halide element comprises a support, at least one layer of a light-sensitive silver halide emulsion providing a gamma value of at least 10, and at least one light-scattering layer provided in such a manner that the light-sensitive silver halide emulsion is exposed to the laser light through the light-scattering layer, wherein the light-scattering layer contains substantially light-insensitive light-scattering particles capable of being dissolved and removed in a development step and selected to have a diameter within the range of from 50% to 150% of the wavelength of the laser light used for the exposure.

29. A photographic light-sensitive silver halide element as in claim 1, wherein said light-scattering particles are selected from the group consisting of silver halide, cadmium sulfate, calcium carbonate, cadmium carbonate, barium oxalate, zinc hydroxide, thallium chloride, a polymethyl methacrylate-acrylic acid copolymer and a free carboxyl or sulfonyl group containing starch derivative.

30. A method for minimizing the occurrence of interference fringe in the formation of a dot image of a screen scanner system which comprises exposing a laser-sensitive photographic light-sensitive silver halide element comprising a support, at least one layer of a light sensitive silver halide emulsion providing a gamma value of at least 10 and a light-scattering layer to a laser light through the light-scattering layer wherein the light-scattering layer is provided in such a manner that the light-sensitive silver halide emulsion layer is exposed to the laser light through the light-scattering layer and contains substantially light-insensitive light-scattering particles capable of being dissolved and removed in a development step and wherein the diameter of the light-scattering particles is from 50 to 150% that of the wavelength of the laser light used for the exposure.

31. The method of claim 30, wherein said development step consists essentially of developing and fixing.

* * * * *